United States Patent
Inoue et al.

(10) Patent No.: US 9,306,539 B2
(45) Date of Patent: Apr. 5, 2016

(54) RESONATOR, FILTER, AND DUPLEXER

(71) Applicant: TAIYO YUDEN CO., LTD., Tokyo (JP)

(72) Inventors: Shogo Inoue, Tokyo (JP); Kentaro Nakamura, Tokyo (JP); Hidetaro Nakazawa, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 49 days.

(21) Appl. No.: 14/290,762

(22) Filed: May 29, 2014

(65) Prior Publication Data

US 2014/0361850 A1 Dec. 11, 2014

(30) Foreign Application Priority Data

Jun. 10, 2013 (JP) ................................ 2013-121946

(51) Int. Cl.
| | |
|---|---|
| H03H 9/02 | (2006.01) |
| H03H 9/72 | (2006.01) |
| H03H 9/64 | (2006.01) |
| H01L 41/047 | (2006.01) |
| H03H 9/145 | (2006.01) |

(52) U.S. Cl.
CPC ............. *H03H 9/725* (2013.01); *H03H 9/6433* (2013.01); *H03H 9/1452* (2013.01); *H03H 9/6436* (2013.01); *H03H 9/6483* (2013.01)

(58) Field of Classification Search
CPC .................................. H03H 9/64; H03H 9/25
USPC ........................ 333/133, 193, 194, 195, 196
See application file for complete search history.

(56) References Cited

U.S. PATENT DOCUMENTS

| | | | | |
|---|---|---|---|---|
| 6,005,326 A | * | 12/1999 | Yoshimoto | ........... H03H 9/6436 310/313 B |
| 7,034,634 B2 | * | 4/2006 | Nakamura | ........... H03H 9/0274 310/313 B |
| 7,965,155 B2 | * | 6/2011 | Nakamura | ......... H03H 9/02858 310/313 B |

(Continued)

FOREIGN PATENT DOCUMENTS

| | | |
|---|---|---|
| JP | 2004-537235 A | 12/2004 |
| JP | 2013-12883 A | 1/2013 |

OTHER PUBLICATIONS

Koskela et al., "Acoustic Loss Mechanisms in Leaky SAW Resonators on Lithium Tantalate", IEEE Transactions on Ultrasonics, Ferroelectrics, and Frequency Control, Nov. 2001, vol. 48, No. 6, pp. 1517-1526.

*Primary Examiner* — Dean Takaoka
(74) *Attorney, Agent, or Firm* — Chen Yoshimura LLP

(57) ABSTRACT

A resonator includes: a first comb-shaped electrode including a first bus bar, first electrode fingers coupled to the first bus bar and extending in an extension direction, and first dummy electrode fingers coupled to the first bus bar; and a second comb-shaped electrode including a second bus bar, second electrode fingers coupled to the second bus bar, extending in the extension direction, and facing the first dummy electrode fingers through first gaps, and second dummy electrode fingers coupled to the second bus bar and facing the first electrode fingers through second gaps, wherein $0.5\lambda \leq \Delta D$ where $\Delta D$ represents a distance in the extension direction between at least two gaps that are at least adjoining two of the first gaps or/and at least adjoining two of the second gaps, and $\lambda$ represents pitches of the first electrode finger and the second electrode finger.

13 Claims, 20 Drawing Sheets

(56) References Cited

U.S. PATENT DOCUMENTS

| | | | | |
|---|---|---|---|---|
| 8,035,463 B2* | 10/2011 | Tanaka | | H03H 9/02551 310/313 A |
| 8,531,252 B2* | 9/2013 | Nakamura | | H04B 1/0057 333/129 |
| 8,723,620 B2* | 5/2014 | Nishimura | | H03H 9/008 333/126 |
| 2004/0247153 A1 | 12/2004 | Ruile et al. | | |
| 2011/0156025 A1 | 6/2011 | Shionoiri et al. | | |
| 2015/0243873 A1* | 8/2015 | Nakanishi | | H01L 41/047 310/313 B |

* cited by examiner

RESONATOR, FILTER, AND DUPLEXER

CROSS-REFERENCE TO RELATED APPLICATION

This application is based upon and claims the benefit of priority of the prior Japanese Patent Application No. 2013-121946, filed on Jun. 10, 2013, the entire contents of which are incorporated herein by reference.

FIELD

A certain aspect of the present invention relates to a resonator, a filter, and a duplexer.

BACKGROUND

Filters and duplexers employed in mobile phones are desired to have low insertion loss and high suppression characteristics. The reason why low insertion loss is desired is as follow. In a case of a transmit filter, as the insertion loss decreases, the electrical power consumption of the mobile phone is reduced, and thus, battery run time can be increased. In a case of a receive filter, as the insertion loss decreases, the S/N (signal/noise) ratio of a reception signal is improved, and the receiving sensitivity and the communication quality of the mobile phone can be improved. Therefore, the insertion loss of the filter is desired to be as small as possible. Ladder-type filters and double-mode filters using an acoustic wave resonator are used as filters employed in mobile phones.

Surface acoustic wave resonators, boundary acoustic wave resonators, and Love wave resonators including an IDT (Interdigital Transducer) have been used as the acoustic wave resonator. The IDT includes two comb-shaped electrodes facing each other on a piezoelectric substrate. Japanese Patent Application Publication Nos. 2004-537235 and 2013-12883 disclose modulating a gap position between an electrode finger and a dummy electrode finger in the IDT. A Rayleigh wave scattering in a surface acoustic wave resonator is described in IEEE Trans. Ultrason. Ferroelect., Freq. Contr., Vol. 48, no. 6, pp. 1517-1526, 2001 (Non Patent Document 1).

In a filter using a resonator including an IDT, loss in the passband and the degree of suppression outside the passband are in a trade-off relationship. That is to say, when the loss in the passband is designed to be small, the suppression outside the passband deteriorates. As described above, it is difficult to reduce the loss in the passband without deteriorating the degree of suppression outside the passband. The loss in the passband of the filter can be reduced by improving the Q value of a resonator in the filter.

SUMMARY OF THE INVENTION

According to an aspect of the present invention, there is provided a resonator including: a first comb-shaped electrode formed on a piezoelectric substrate and including a first bus bar, first electrode fingers coupled to the first bus bar and extending in an extension direction, and first dummy electrode fingers coupled to the first bus bar; and a second comb-shaped electrode formed on the piezoelectric substrate and including a second bus bar, second electrode fingers coupled to the second bus bar, extending in the extension direction, and facing the first dummy electrode fingers through first gaps, and second dummy electrode fingers coupled to the second bus bar and facing the first electrode fingers through second gaps, wherein $\Delta D$ is $0.5\lambda$ or greater ($0.5\lambda \leq \Delta D$) where $\Delta D$ represents a distance in the extension direction between at least two gaps that are at least adjoining two of the first gaps and/or at least adjoining two of the second gaps, and $\lambda$ represents a pitch of the first electrode finger and the second electrode finger.

According to another aspect of the present invention, there is provided a filter including: the above resonator.

According to another aspect of the present invention, there is provided a duplexer including: a first filter connected between a common terminal and a first terminal; and a second filter connected between the common terminal and a second terminal, wherein at least one the first filter and the second filter is the above filter.

DETAILED DESCRIPTION

Figure 1:
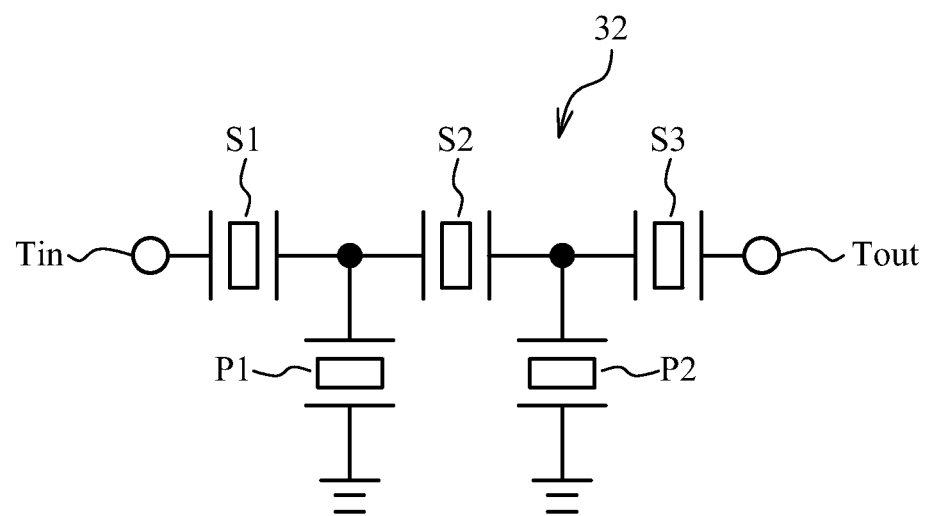
FIG. 1 is a circuit diagram illustrating a ladder-type filter.

A description will first be given of an exemplary filter using a resonator in accordance with embodiments described hereinafter. FIG. 1 is a circuit diagram illustrating a ladder-type filter. As illustrated in FIG. 1, a ladder-type filter 32 includes one or more series resonators S1~S3 and one or more parallel resonators P1~P2. The series resonators S1~S3 are connected in series between an input terminal Tin and an output terminal Tout. The parallel resonators P1~P2 are connected in parallel between the input terminal Tin and the output terminal Tout.

Figure 2:
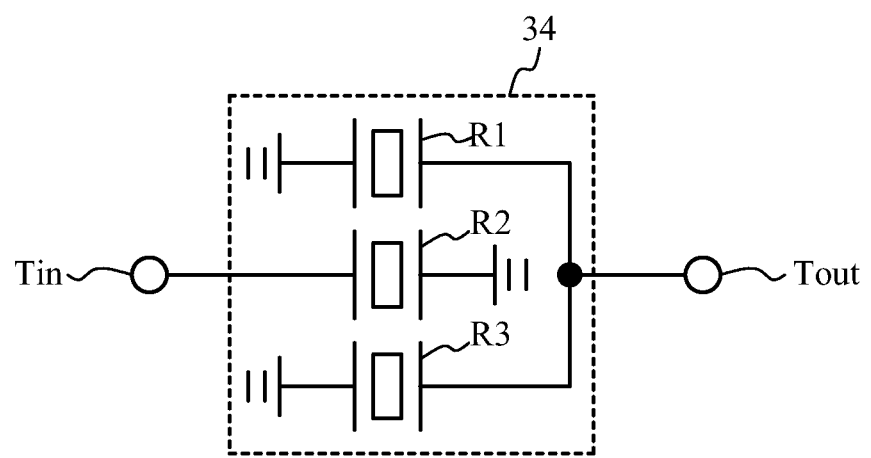
FIG. 2 is a circuit diagram illustrating a multimode filter.

FIG. 2 is a circuit diagram illustrating a multimode filter. As illustrated in FIG. 2, a multimode filter 34 includes resonators R1~R3. The resonators R1~R3 are arranged in the propagation direction of an acoustic wave. A first end of the resonator R2 is coupled to the input terminal Tin, and a second end is coupled to a ground. First ends of the resonators R1 and R3 are coupled to the output terminal Tout, and second ends are coupled to a ground.

Figure 3:
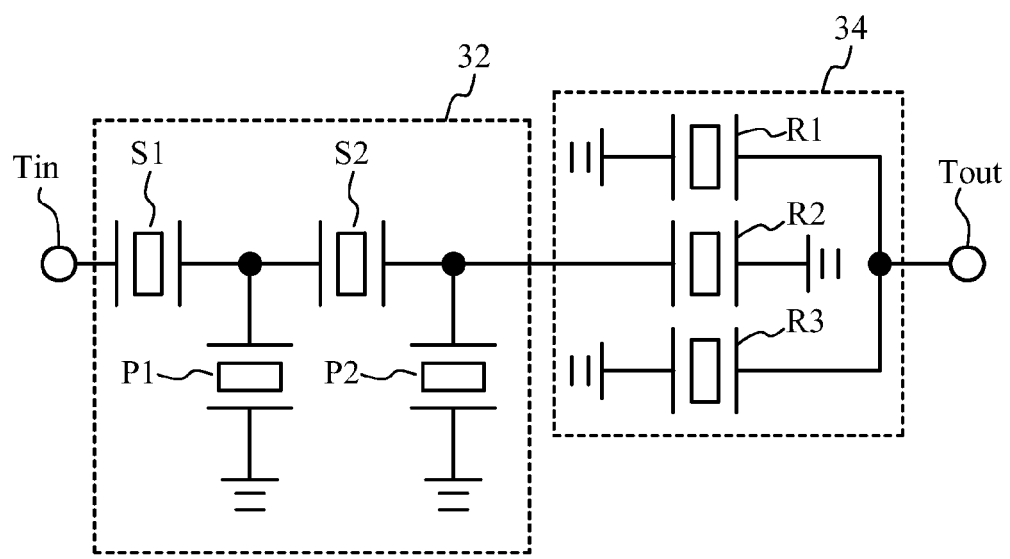
FIG. 3 is a circuit diagram illustrating a filter formed by combining a ladder-type filter and a multimode filter.

FIG. 3 is a circuit diagram illustrating a filter formed by combining the ladder-type filter and the multimode filter. As illustrated in FIG. 3, the ladder-type filter 32 and the multimode filter 34 are connected between the input terminal Tin and the output terminal Tout. The ladder-type filter 32 includes the series resonators S1~S2 and the parallel resonators P1~P2. The multimode filter 34 include the resonators R1~R3.

Figure 4:
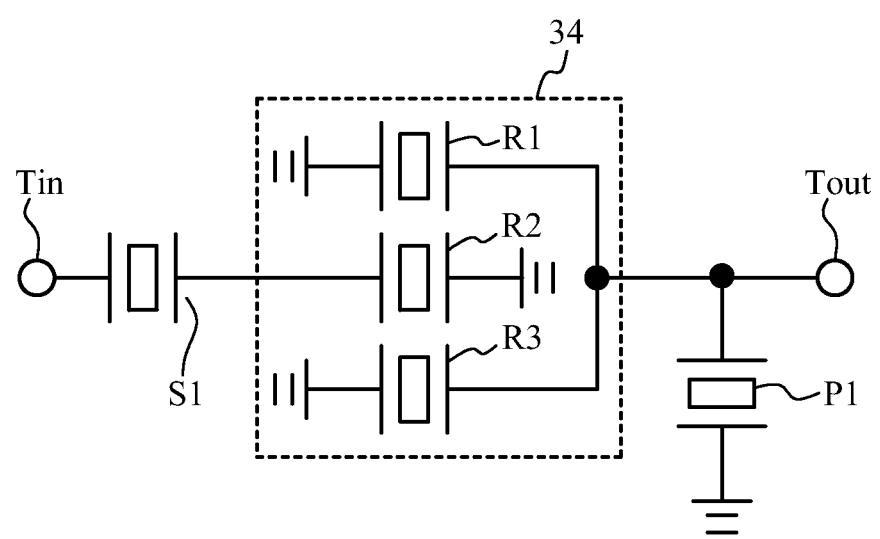
FIG. 4 is a circuit diagram illustrating a filter formed by combining a multimode filter and a resonator.

FIG. 4 is a circuit diagram illustrating a filter formed by combining the multimode filter and the resonator. As illustrated in FIG. 4, the series resonator S1 and the multimode filter 34 are connected in series between the input terminal Tin and the output terminal Tout, and the parallel resonator P1 is connected in parallel.

Figure 5A:
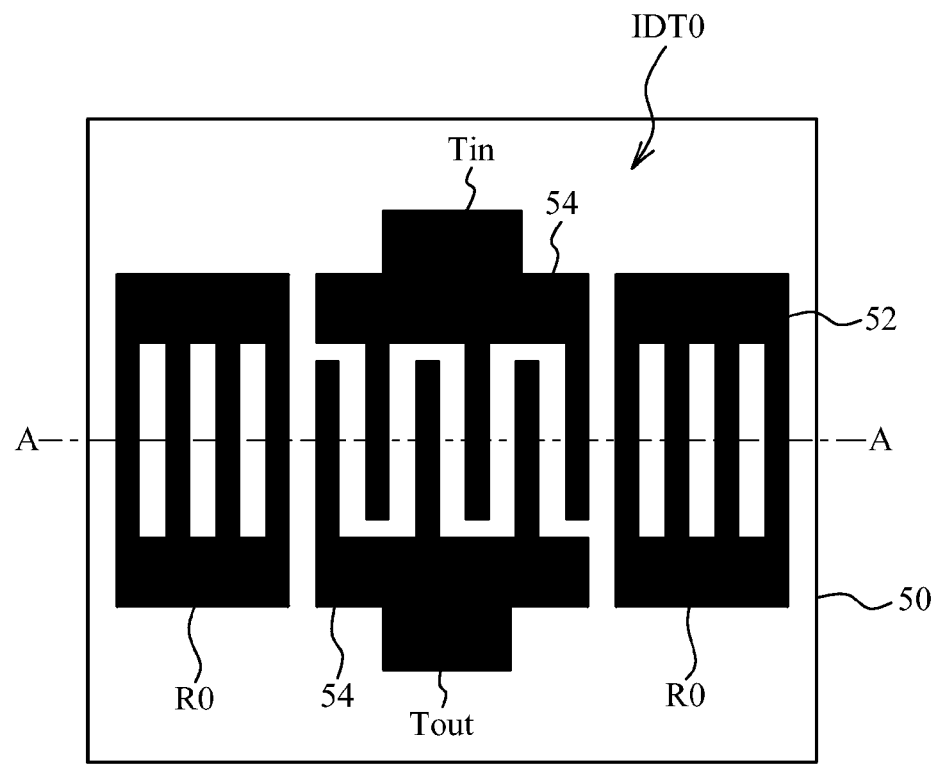
FIG. 5A is a plan view illustrating a surface acoustic wave resonator.
Figure 5B:
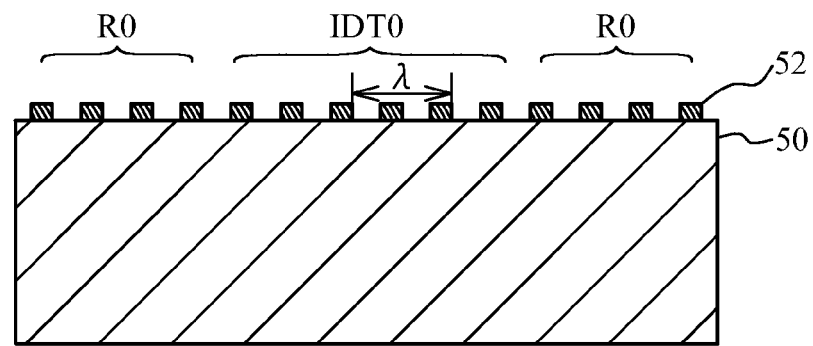
FIG. 5B is a cross-sectional view taken along line A-A in FIG. 5A.

A description will next be given of a resonator used in the filter. FIG. 5A is a plan view illustrating a surface acoustic wave resonator, and FIG. 5B is a cross-sectional view taken along line A-A in FIG. 5A. As illustrated in FIG. 5A and FIG. 5B, a metal film 52 made of aluminum or copper is formed on a piezoelectric substrate 50 made of lithium tantalate (LiTaO$_3$) or lithium niobate (LiNbO$_3$). The metal film 52 forms reflectors R0, an IDT (Interdigital Transducer) IDT0, the input terminal Tin, and the output terminal Tout. The IDT0 includes two comb-shaped electrodes 54. A first one of the comb-shaped electrodes 54 is coupled to the input terminal Tin, and a second one is coupled to the output terminal Tout. The input terminal Tin and the output terminal Tout are, for example, pads. The reflectors R0 are located at both sides of the IDT0 in the propagation direction of the acoustic wave. The comb-shaped electrodes 54 and the reflectors R0 include electrode fingers arranged at intervals corresponding to the wavelength λ of the acoustic wave. The acoustic wave excited by the IDT0 is reflected by the reflectors R0. This resonates the surface acoustic wave resonator at a frequency corresponding to the wavelength of the acoustic wave.

Figure 6A:
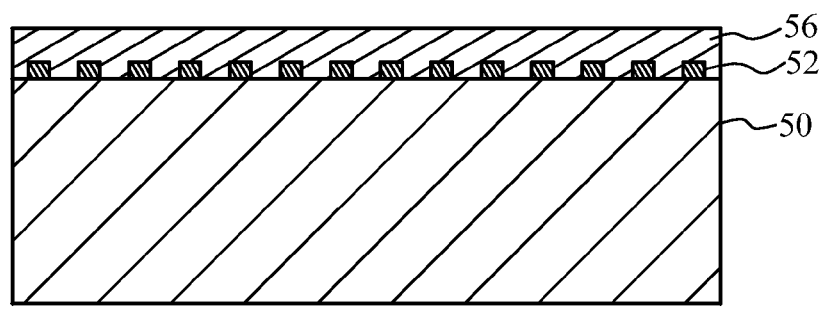
FIG. 6A is a cross-sectional view of a Love wave resonator.
Figure 6B:
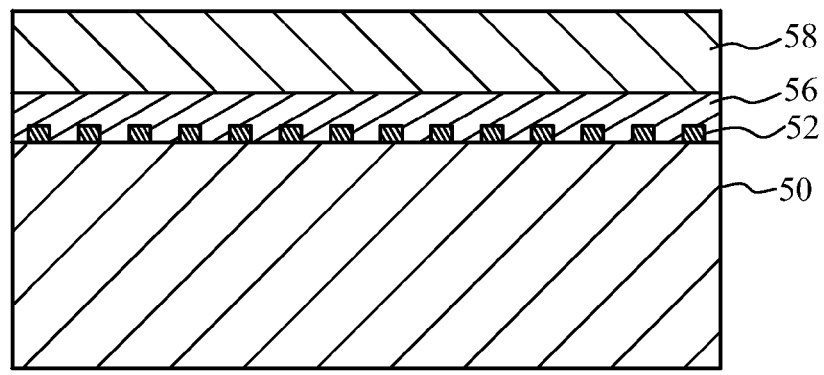
FIG. 6B is a cross-sectional view of a boundary acoustic wave resonator.

FIG. 6A is a cross-sectional view of a Love wave resonator, and FIG. 6B is a cross-sectional view of a boundary acoustic wave resonator. The plan views of the Love wave resonator and the boundary acoustic wave resonator are the same as FIG. 5A, and a description thereof is omitted. As illustrated in FIG. 6A, in the Love wave resonator, a dielectric film 56 is formed so as to cover the metal film 52. A silicon oxide film may be used as the dielectric film 56. As illustrated in FIG. 6B, in the boundary acoustic wave resonator, the dielectric film 56 is formed so as to cover the metal film 52. Furthermore, a dielectric film 58 is formed on the dielectric film 56. The dielectric film 58 is, for example, an aluminum oxide film. To confine the acoustic wave in the dielectric film 56, the dielectric film 58 preferably has an acoustic velocity greater than that of the dielectric film 56.

Figure 7:
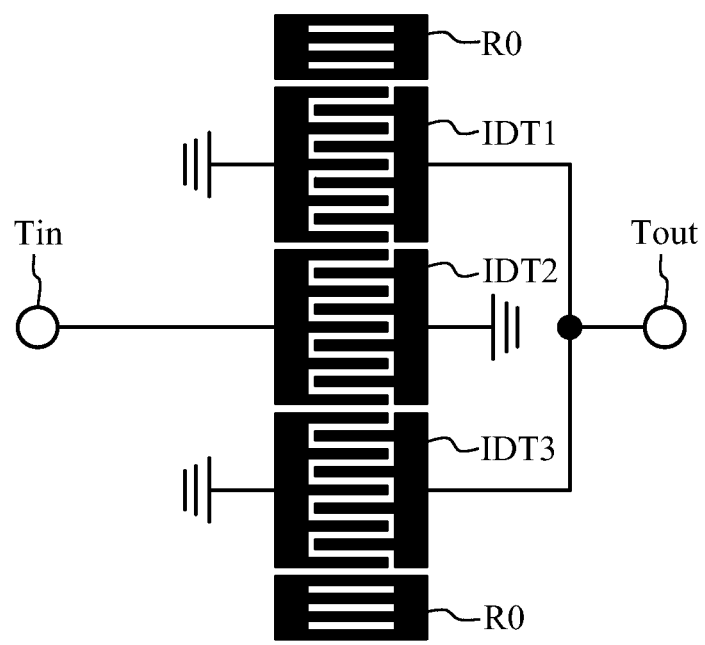
FIG. 7 is a diagram illustrating a multimode filter.

A description will now be given of an exemplary multimode filter. FIG. 7 is a diagram illustrating a multimode filter, and is a plan view of a multimode filter using a surface acoustic wave, a Love wave, or a boundary acoustic wave. As illustrated in FIG. 7, an IDT1~an IDT3 are arranged between the reflectors R0 in the propagation direction of the acoustic wave. A first comb-shaped electrode of the IDT2 is coupled to the input terminal Tin, and a second comb-shaped electrode is coupled to a ground. First comb-shaped electrodes of the IDT1 and the IDT3 are coupled to the output terminal Tout, and second comb-shaped electrodes are coupled to the ground. In FIG. 7, the output is an unbalanced output, but may be a balanced output.

First Embodiment

Figure 8:
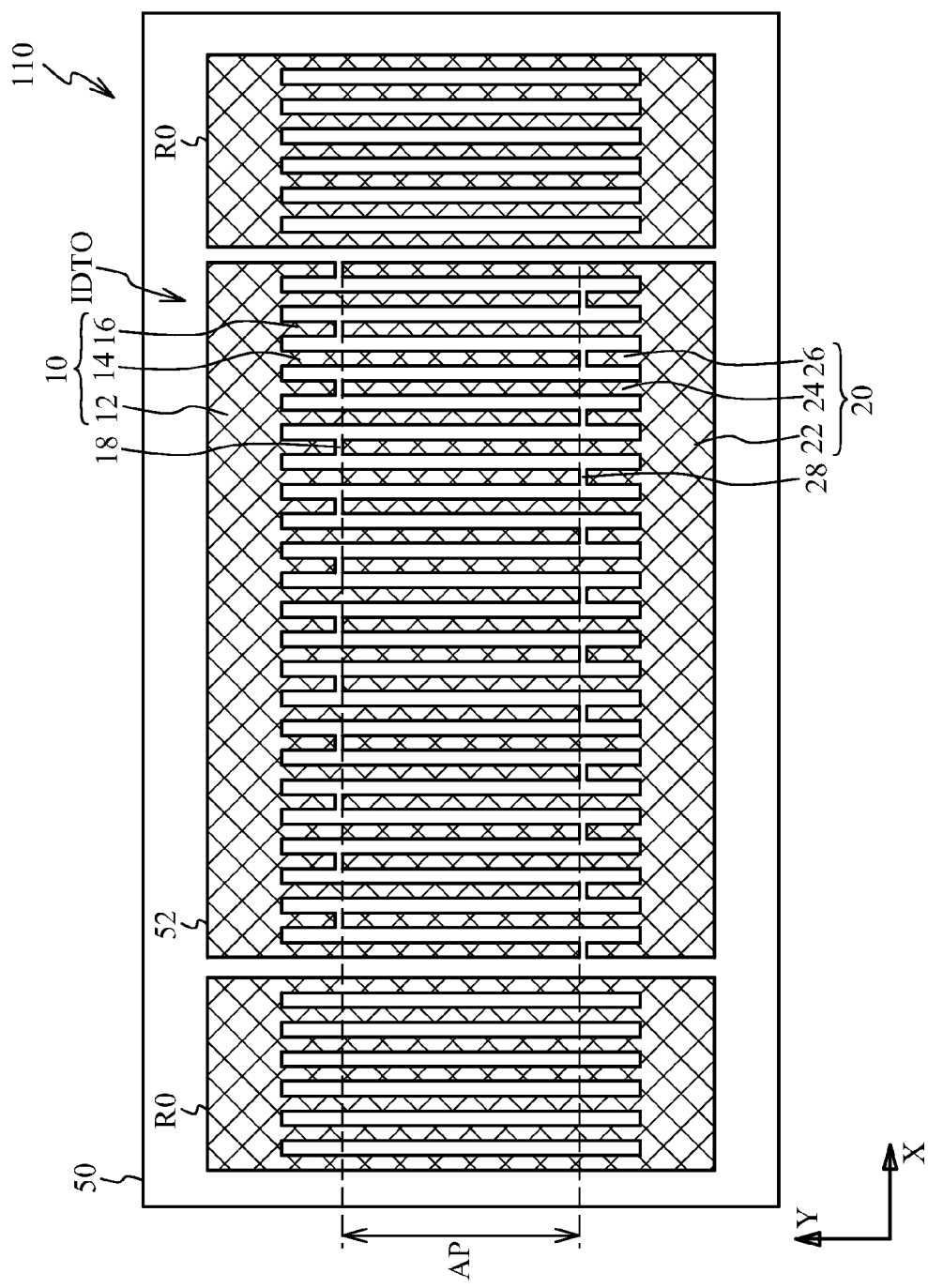
FIG. 8 is a plan view of a resonator in accordance with a first comparative example.

FIG. 8 is a plan view illustrating a resonator in accordance with a first comparative example. The propagation direction of the acoustic wave is the X direction, and the extension direction of the electrode finger is the Y direction. As illustrated in FIG. 8, a resonator 110 of the first comparative example includes the piezoelectric substrate 50, the reflectors R0, and an IDT0. The metal film 52 made of aluminum or copper is formed on the piezoelectric substrate 50 made of lithium tantalate or lithium niobate. The metal film 52 forms the reflectors R0 and the IDT0. The IDT0 includes a first comb-shaped electrode 10 and a second comb-shaped electrode 20. The first comb-shaped electrode 10 includes a first bus bar 12, first electrode fingers 14, and first dummy electrode fingers 16. The first electrode fingers 14 extend in the Y direction, and are coupled to the first bus bar 12 in the +Y direction. The first dummy electrode fingers 16 extend in the Y direction, and are coupled to the first bus bar 12 in the +Y direction. The first electrode fingers 14 and the first dummy electrode fingers 16 are alternately coupled to the first bus bars 12. The first electrode fingers 14 and the first dummy electrode fingers 16 may not be alternately located.

The second comb-shaped electrode 20 includes a second bus bar 22, second electrode fingers 24, and second dummy electrode fingers 26. The second electrode fingers 24 extend in the Y direction, and are coupled to the second bus bar 22 in the −Y direction. The second dummy electrode fingers 26 extend in the Y direction, and are coupled to the second bus bar 22 in the −Y direction. The first electrode fingers 14 face the second dummy electrode fingers 26 across second gaps 28 in the Y direction. The second electrode fingers 24 face the first dummy electrode fingers 16 across first gaps 18 in the Y direction. The first gaps 18 are located in the same position in the Y direction. The second gaps 28 are located in the same position in the Y direction. The length in the Y direction along which the first electrode finger 14 overlaps with the second electrode finger 24 is an overlapping width AP. A ratio of an electrode finger width to an electrode finger pitch λ is a duty ratio.

Figure 9:
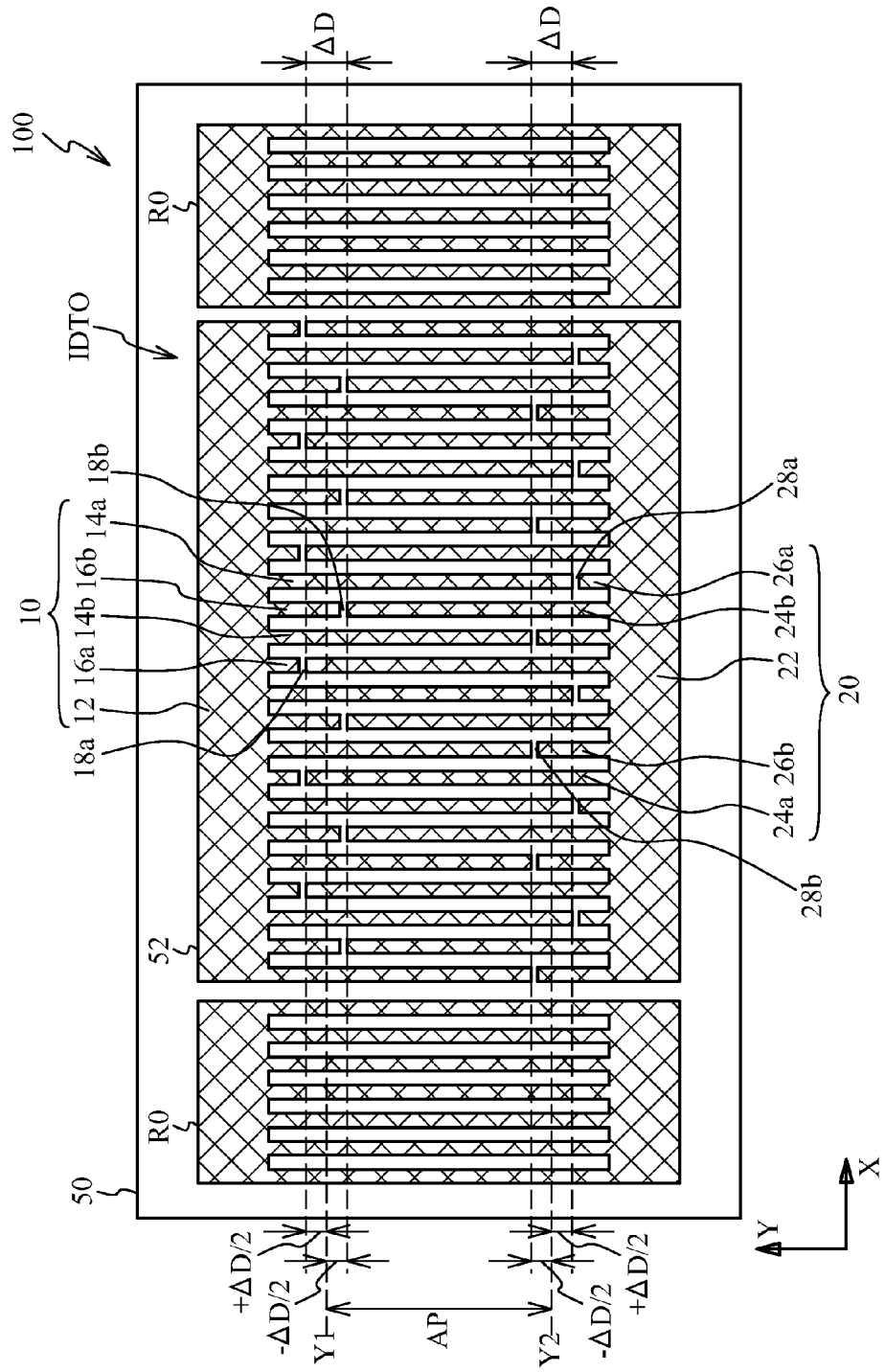
FIG. 9 is a plan view of a resonator in accordance with the first embodiment.

FIG. 9 is a plan view of a resonator in accordance with a first embodiment. As illustrated in FIG. 9, in a resonator 100 of the first embodiment, second electrode fingers 24a and 24b have different lengths in each pair. Thus, first dummy electrode fingers 16a and 16b have different lengths in each pair, and the positions of first gaps 18a and 18b in the Y direction differ from each other in each pair. The Y-coordinates of the first gaps 18a and 18b differ from a Y-coordinate Y1 by +ΔD/2 and −ΔD/2 respectively. The distance between the first gaps 18a and 18b in the Y direction is a modulation width ΔD. First electrode fingers 14a and 14b have different lengths in each pair, second dummy electrode fingers 26a and 26b have different lengths in each pair, and the positions of second gaps 28a and 28b in the Y direction differ from each other in each pair. The Y-coordinates of the second gaps 28a and 28b differ from a Y-coordinate Y2 by +ΔD/2 and −ΔD/2 respectively. The distance between the second gaps 28a and 28b in the Y direction is the modulation width ΔD. The distance between Y-coordinates Y1 and Y2 in the Y direction is the overlapping width AP. When the overlapping width AP of the first embodiment is made to be the same as the overlapping width AP of the first comparative example, the electrostatic capacitance in the first embodiment is approximately equal to the electrostatic capacitance in the first comparative example.

Surface acoustic wave resonators of the first comparative example and the first embodiment were fabricated. The fabricated resonators have the following structure.

Piezoelectric substrate 50: 42° Y-cut lithium tantalate substrate
Metal film 52: aluminum, film thickness of 193 nm
Electrode finger pitch λ in the IDT: 2.0 μm
Number of pairs of the electrode fingers in the IDT: 116 pairs
Duty ratio in the IDT: 50%
Electrode finger pitch in the reflector: 1.0 μm
Number of the electrode fingers in the reflector: 40
Duty ratio in the reflector: 50%
Overlapping width AP: 20λ (40 μm)
Length of the dummy electrode finger: 2λ (4 μm)
Modulation width ΔD is varied from 0 to 3.5λ.

Figure 10A:
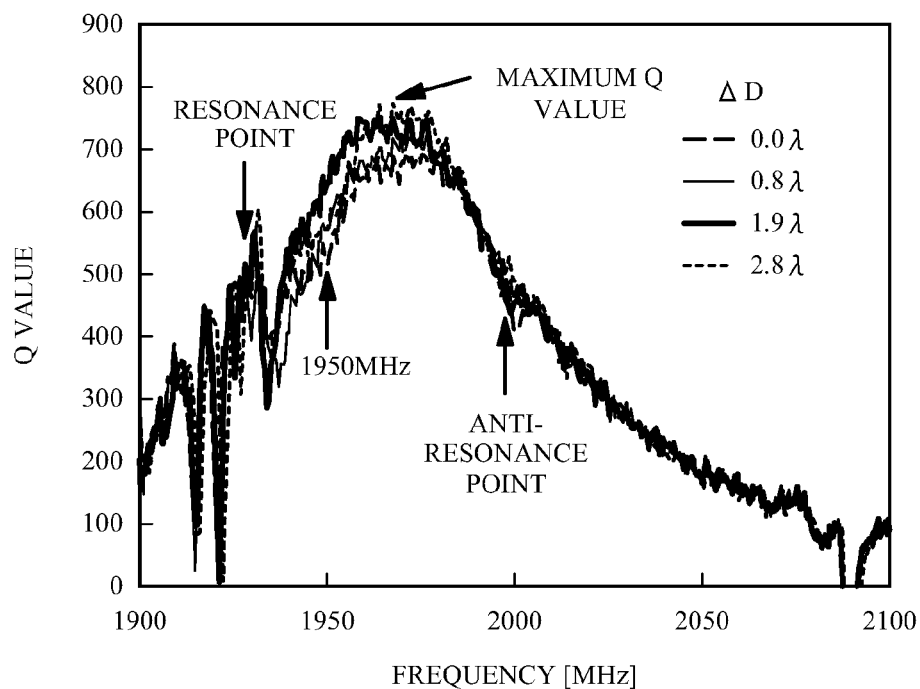
FIG. 10A and FIG. 10B are diagrams illustrating a Q value with respect to a frequency in the first comparative example and the first embodiment.
Figure 10B:
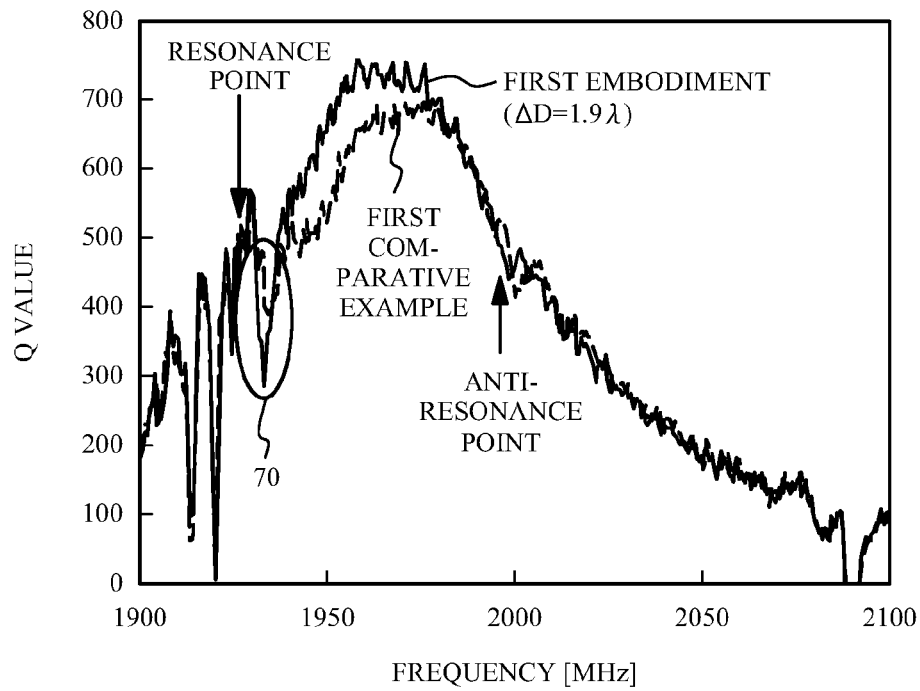

FIG. 10A and FIG. 10B are diagrams illustrating a Q value with respect to a frequency in the first comparative example and the first embodiment. As illustrated in FIG. 10A, a case of ΔD=0.0λ is the first comparative example, and cases of ΔD=0.8λ, 1.9λ, and 2.8λ are the first embodiment. In the first embodiment, the Q value between the resonance point and the anti-resonance point is improved compared to the first comparative example. The resonator of ΔD=2.8λ has a Q value greater than those of other resonators at the frequency at which the Q value reaches a maximum. The resonator of ΔD=1.9λ has a Q value greater than those of other resonators at 1950 MHz. As illustrated in FIG. 10B, the Q value of the resonator of ΔD=1.9λ decreases in a region 70 of which frequencies are slightly higher than that of the resonance point. At frequencies between the resonance point and the anti-resonance point other than the frequencies in the region 70, the resonator of ΔD=1.9λ has a Q value greater than that of the first comparative example.

Figure 11:
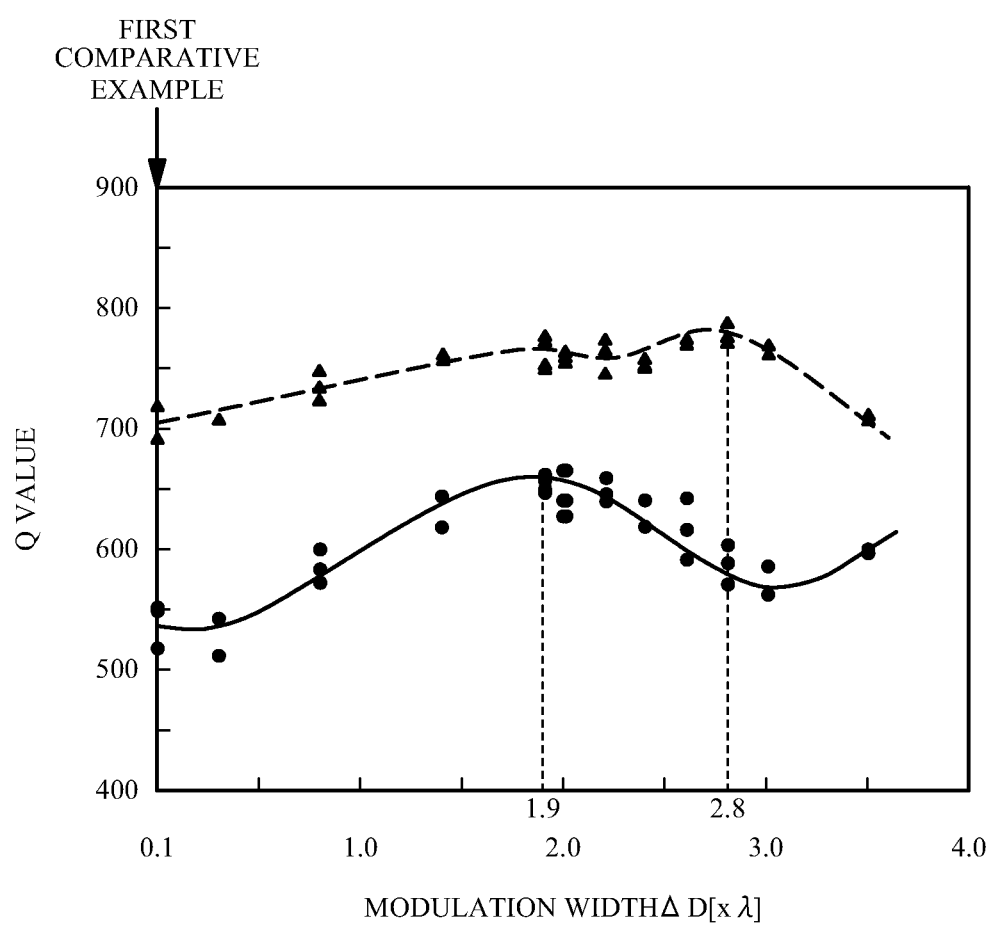
FIG. 11 is a diagram illustrating a Q value with respect to $\Delta D$ in the first embodiment.

FIG. 11 is a diagram illustrating a Q value with respect to ΔD in the first embodiment. In FIG. 11, the black triangle and the dashed line indicate the maximum Q value with respect to the frequency. The black triangles indicate measurement points, and the dashed line is an approximate line. The black circles indicate measurement points of the Q value at a frequency of 1950 MHz, and the solid line is an approximate line. A frequency of 1950 MHz is located about midway between the frequency at which the Q value reaches a maximum value and the resonance point. This corresponds to the frequency near the center of the passband of the series resonator of the ladder-type filter. The maximum Q value reaches a maximum when ΔD is 2.8λ. The Q value at 1950 MHz reaches a maximum when ΔD is 1.9λ. The Q value becomes greater than that of the first comparative example (ΔD=0.0λ) when ΔD is 0.5λ or greater. The Q value becomes even greater when ΔD is 1.0λ or greater, and becomes even greater when ΔD is 1.5λ or greater. The maximum Q value becomes greater than that of the first comparative example when ΔD is 3.5λ or less. The Q value becomes even greater when ΔD is 3.0λ or less.

Figure 12:
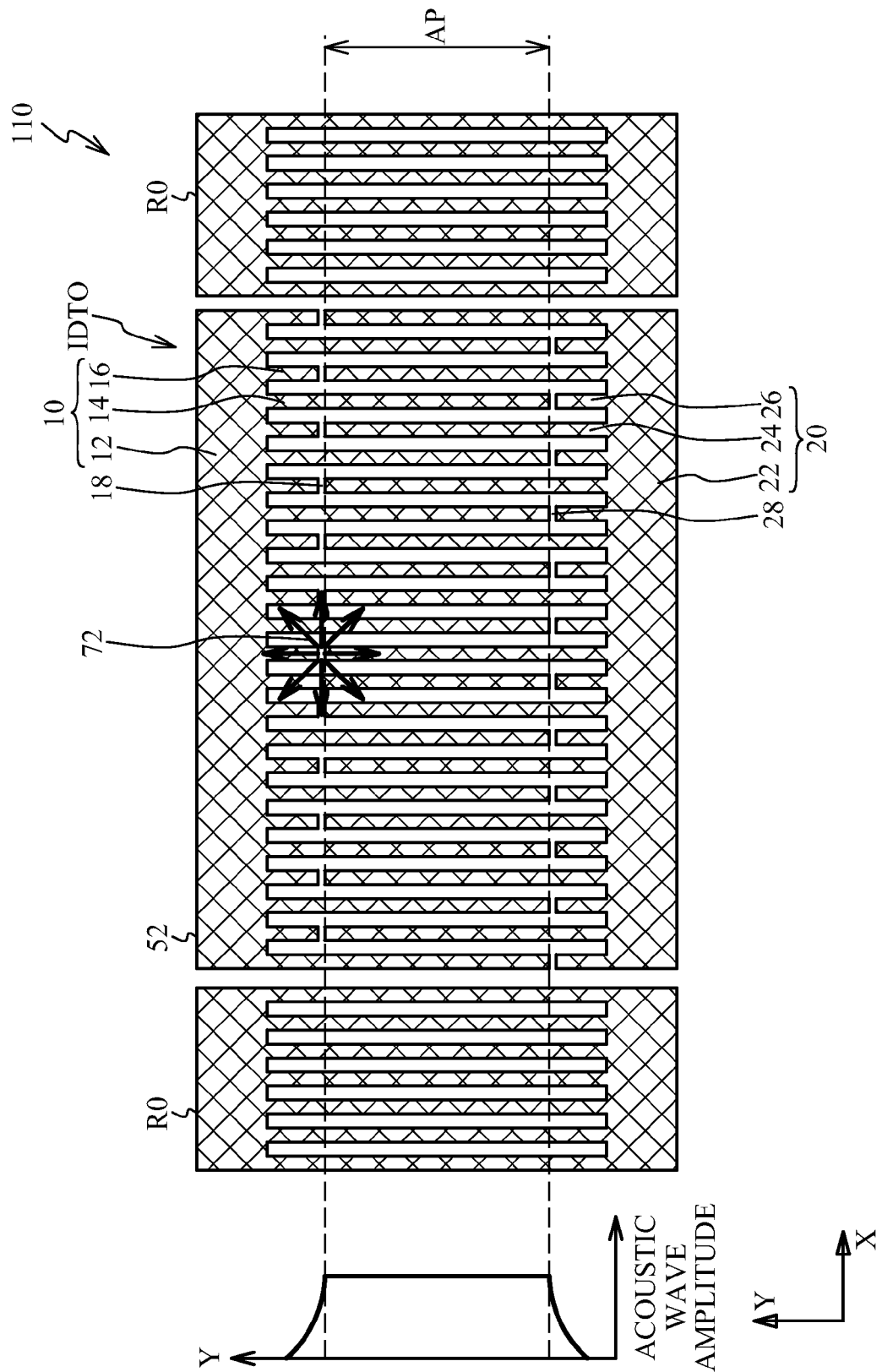
FIG. 12 is a diagram illustrating an acoustic wave scattering in a gap in the first comparative example.

FIG. 12 is a diagram illustrating an acoustic wave scattering in the gap of the first comparative example. FIG. 12 illustrates an acoustic wave amplitude in the Y direction in the resonator 110 of the first comparative example at the left side. In the overlapping width AP, the acoustic wave amplitude is high, and the acoustic wave propagates in the X direction. The acoustic wave partly exists outside the overlapping width AP (the region including the gap and the dummy electrode). Thus, the acoustic wave propagating in the X direction Rayleigh-wave scatters in the gap 18, and is radiated as a Rayleigh wave 72. The propagation of the Rayleigh wave 72 causes the loss of the resonator, and decreases the Q value. A Rayleigh wave scattering in the gap is described in Non Patent Document 1.

The Rayleigh wave 72 is scattered in all 360-degree directions in one first gap 18. When the first gaps 18 with the same Y-coordinate are arranged in the X direction, the Rayleigh waves 72 scattering in the first gaps 18 overlap each other. This generates directions in which the amplitude of the Rayleigh wave 72 increases and decreases. For example, there are three directions in which the amplitude of the Rayleigh wave 72 scattering to the outside of the overlapping width AP in the first gap 18 increases: the +Y direction, 40 degrees from the +X direction to the +Y direction, and 40 degrees from the −X direction to the +Y direction. There are three directions in which the amplitude of the Rayleigh wave 72 scattering to the outside of the overlapping width AP in the second gap 28 increases: the −Y direction, 40 degrees from the +X direction to the −Y direction, and 40 degrees from the −X direction to the −Y direction. As described above, the Rayleigh wave 72 propagates not only in the ±Y direction but also in an oblique direction.

Figure 13:
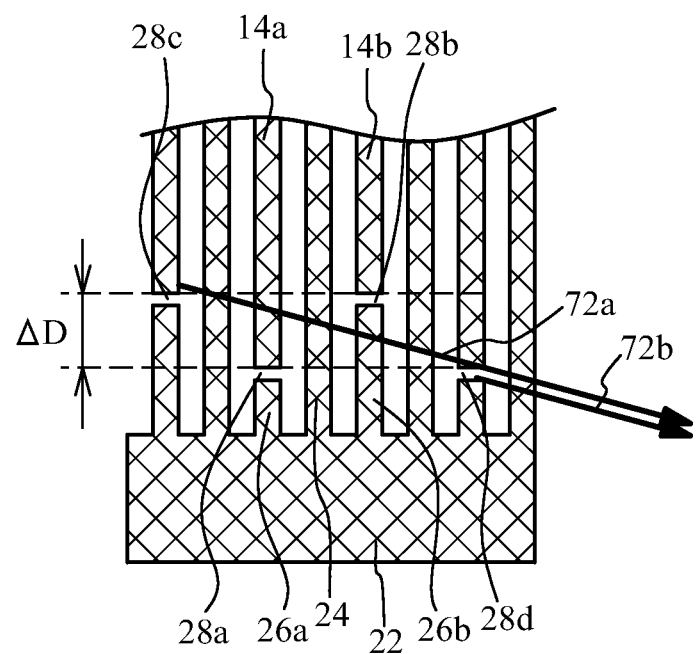
FIG. 13 is a diagram illustrating an acoustic wave scattering in a gap in the first embodiment.

FIG. 13 is a diagram illustrating an acoustic wave scattering in the gap of the first embodiment. As illustrated in FIG. 13, the acoustic wave is scattered in a second gap 28c, and a Rayleigh wave 72a propagates in an oblique direction. The acoustic wave is scattered in a second gap 28d, and a Rayleigh wave 72b propagates in an oblique direction. When the phases of the Rayleigh wave 72a and 72b cancel out each other, the Rayleigh wave 72a is prevented from leaking to the outside of the overlapping width AP. The optimum value of ΔD depends on the velocities of the Rayleigh waves 72a and 72b. The change in the velocity of the Rayleigh wave on a Y-cut lithium tantalate substrate or a Y-cut lithium niobate substrate due to a cut angle is very small. Even when the cut angle is changed, the rate of change of the velocity of the Rayleigh wave is a few percent or less. Accordingly, the application range of ΔD is generally applicable to a lithium tantalate substrate and a lithium niobate substrate. In addition, even when the piezoelectric substrate 50 is bonded to the support substrate, the aforementioned range is applicable as the range of ΔD. The gaps 18, 28 are usually fabricated so as to have a size in the Y direction less than or equal to 0.25λ.

It is sufficient if the first gaps 18 and/or the second gaps 28 are modulated by 0.5λ or greater. The gaps do not have to be alternately modulated. For example, the first gaps 18a may be continuously located in the X direction, or the first gaps 18b may be continuously located. It is sufficient if the distance between the first gap 18a located at the end of the continuing first gaps 18a and the adjacent first gap 18b is 0.5λ or greater. In addition, ΔD does not have to be constant. For example, the first gaps 18 may be modulated by different distances ΔD with respect to the X direction. It is sufficient if ΔD is 0.5λ or greater in at least two adjoining first gaps 18a and 18b of the first gaps 18. This applies to the second gaps 28a and 28b.

As described above, it is sufficient if ΔD is 0.5λ or greater (0.5λ≤ΔD) where ΔD represents the distance between at least two gaps that are at least two adjoining first gaps 18a and 18b and/or at least two adjoining second gaps 28a and 28b, and λ represents the pitch of the first electrode finger and the second electrode finger. This structure improves the Q value of the resonator. The modulation width ΔD is preferably 3.0λ or less (ΔD≤3.0λ), and more preferably greater than or equal to 1.5λ and less than or equal to 3.0λ (1.5λ≤ΔD≤3.0λ).

In addition, the Q value of the resonator can be improved by making ΔD greater than 0.066×AP (ΔD>0.066×AP). The modulation width ΔD may be greater than 0.075×AP (ΔD>0.075×AP).

Second Embodiment

Figure 14A:
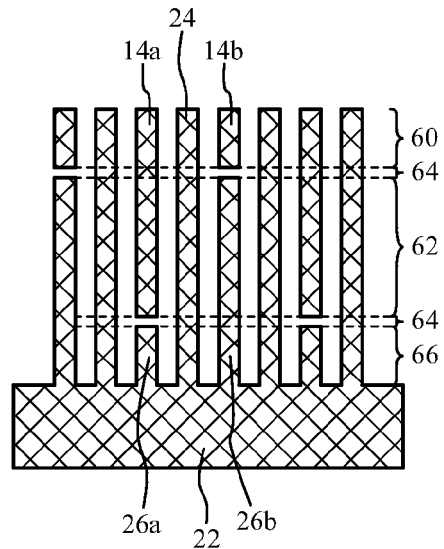
FIG. 14A is an enlarged view around the gap in the first embodiment.
Figure 14B:
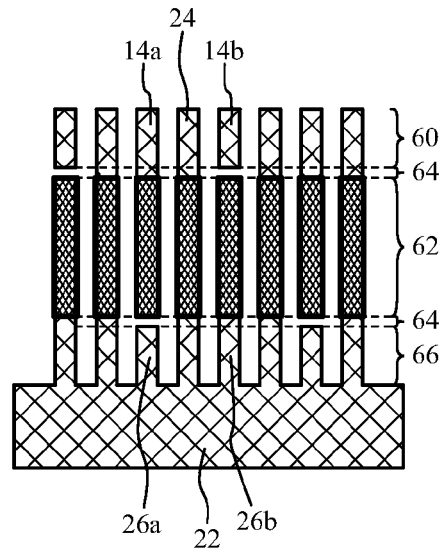
FIG. 14B is an enlarged view around a gap in a second embodiment.

A second embodiment improves the Q value in the region 70 of FIG. 10B. FIG. 14A is an enlarged view around the gap in the first embodiment, and FIG. 14B is an enlarged view around a gap in the second embodiment. As illustrated in FIG. 14A, a region between the second gaps 28a and 28b in the Y direction is referred to as a first region 62. In FIG. 9, the first region 62 is a region between the first gaps 18a and 18b and a region between the second gaps 28a and 28b. As illustrated in FIG. 14A, a region in which the first electrode finger 14 overlaps with the second electrode finger 24 in the Y direction is referred to as a second region 60. In FIG. 9, the second region 60 is a region between the first gap 18b and the second gap 28b. As illustrated in FIG. 14A, regions corresponding to the first gaps 18a and 18b and the second gaps 28a and 28b in the Y direction are referred to as third regions 64. A region between the first gap 18a and the first bus bar 12 and a region between the second gap 28a and the second bus bar 22 are referred to as fourth regions 66.

In the first embodiment, duty ratios of the electrode fingers 14a and 14b and the dummy electrode fingers 26a and 26b are the same in the first region 62, the second region 60, the third region 64, and the fourth region 66.

As illustrated in FIG. 14B, in the second embodiment, the duty ratio of the electrode fingers 14a and 24 and the dummy electrode finger 26b in the first region 62 is greater than the duty ratios in the second region 60, the third region 64, and the fourth region 66. Other structures are the same as those of the first embodiment, and a description thereof is omitted.

Resonators of the first comparative example and the first and second embodiments having the following duty ratios were fabricated. In the first and second embodiments, ΔD is 1.9λ. Other structures are the same as those described in FIG. 8 and FIG. 9.

|  | First comparative example and first embodiment | Second embodiment |
|---|---|---|
| First region 62: | 50% | 55% |
| Second region 60: | 50% | 50% |
| Third region 64: | 50% | 50% |
| Fourth region 66: | 50% | 50% |

Figure 14C:
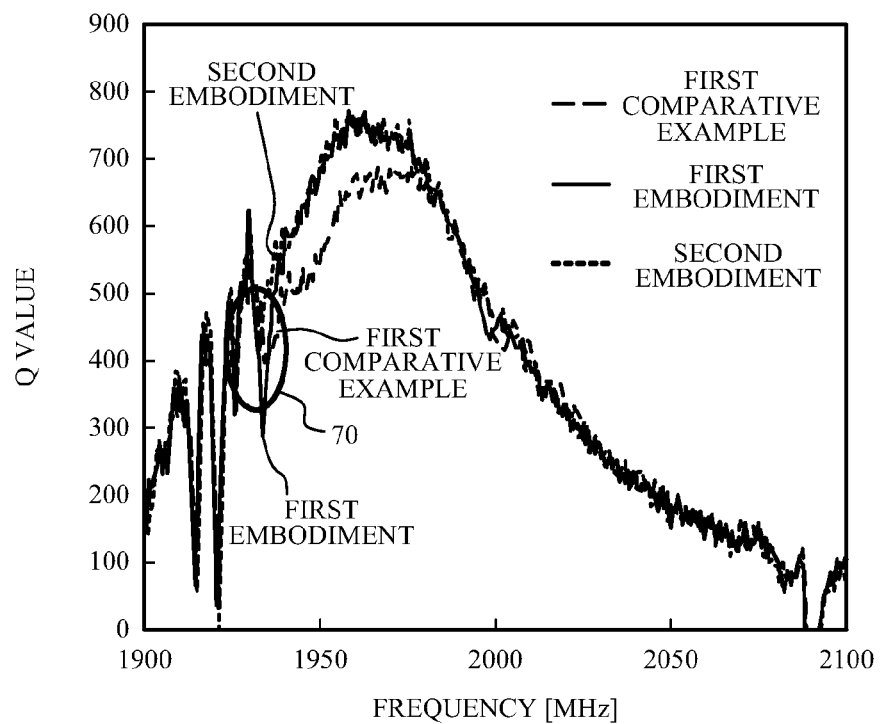
FIG. 14C is a diagram illustrating a Q value with respect to a frequency in the first comparative example and the first and second embodiments.

FIG. 14C is a diagram illustrating a Q value with respect to a frequency of the fabricated resonators of the first comparative example and the first and seconds embodiments. In the region 70, the Q value of the second embodiment is greater than those of the first embodiment and the first comparative example.

Third Embodiment

Figure 15A:
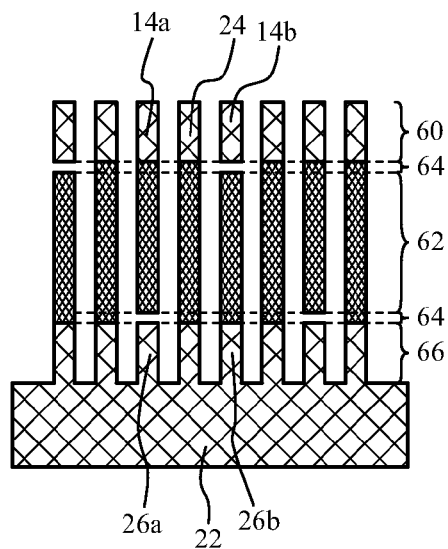
FIG. 15A is an enlarged view around a gap in a third embodiment.

FIG. 15A is an enlarged view around a gap in a third embodiment. As illustrated in FIG. 15A, in the third embodiment, the duty ratios of the electrode fingers 14a, 14b, 24 and the dummy electrode finger 26b in the first region 62 and the third region 64 are greater than the duty ratios in the second region 60 and the fourth region 66. Other structures are the same as those of the second embodiment, and a description thereof is omitted.

Resonators of the first comparative example and the first and third embodiments having the following duty ratios were fabricated. In the first and third embodiments, ΔD is 1.9λ. Other structures are the same as those described in FIG. 8 and FIG. 9.

|  | First comparative example and first embodiment | Third embodiment |
|---|---|---|
| First region 62: | 50% | 55% |
| Second region 60: | 50% | 50% |
| Third region 64: | 50% | 55% |
| Fourth region 66: | 50% | 50% |

Figure 15B:
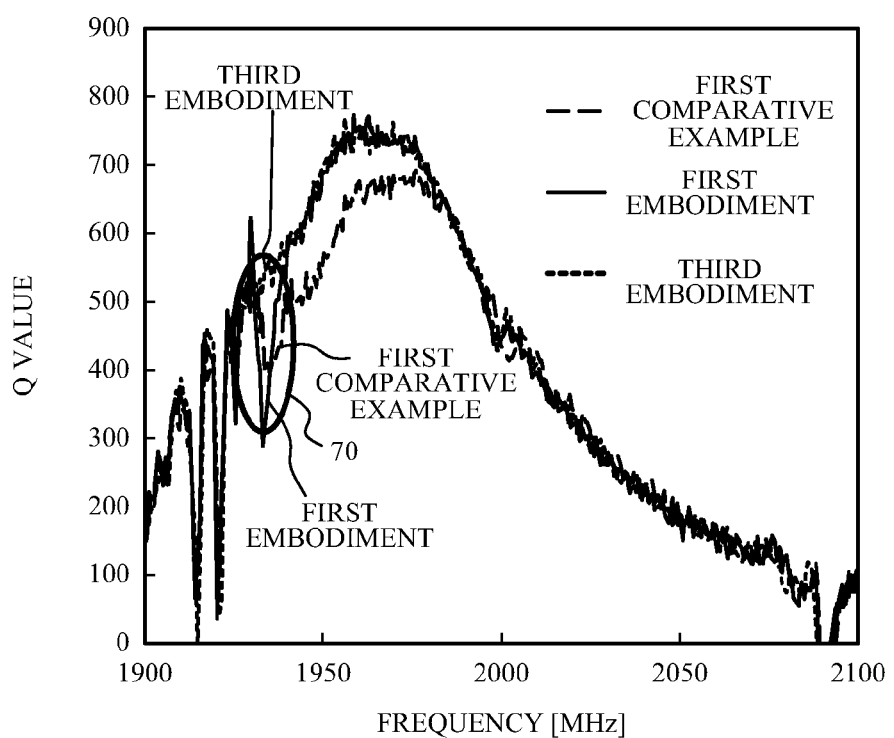
FIG. 15B is a diagram illustrating a Q value with respect to a frequency in the first comparative example and the first and third embodiments.

FIG. 15B is a diagram illustrating a Q value with respect to a frequency of the fabricated resonators of the first comparative example and the first and third embodiments. Compared to FIG. 14B, in the region 70, the Q value of the third embodiment is even greater than the Q value of the second embodiment.

When the duty ratio is changed, the velocity of the Rayleigh wave changes. For example, when the duty ratio is increased, the velocity of the Rayleigh wave decreases. As described above, in the second and third embodiments, a phase relationship between the Rayleigh waves 72a and 72b in FIG. 13 is adjusted and the Q value can be improved by making the duty ratio in the first region 62 different from that in the second region 60. The duty ratio in the first region 62 may be less than the duty ratio in the second region 60. In the third embodiment, a phase relationship between the Rayleigh waves 72a and 72b can be adjusted and the Q value can be improved by making the duty ratios in the first region 62 and the third region 64 different from that in the second region 60.

The duty ratio in the fourth region 66 may differ from that in the second region 60. The duty ratios in the first region 62, the third region 64, and the fourth region 66 may differ from each other. The duty ratios in the first region 62, the third region 64, and the fourth region 66 may not be uniform. For example, the duty ratio may be modulated in the Y direction. The duty ratios in the first region 62 and the third region 64 may differ from the duty ratio in the second region 60 by ±2% to ±20%.

In the second and third embodiments, the duty ratio of the second electrode fingers 24, which are the first electrode fingers and/or the second electrode fingers corresponding to at least two gaps 28a and 28b, and the second dummy electrode fingers 26, which are the first dummy electrode fingers and/or the second dummy electrode fingers corresponding at least two gaps 28a and 28b, in the first region 62 located between at least two gaps 28a and 28b differ from the duty ratio of the first electrode fingers 14 and the second electrode fingers 24 in the second region 60. This structure allows the Q value in the region 70 to be improved.

The duty ratio of the second electrode finger 24 and the dummy electrode finger 26 in the first region 62 is preferably greater than the duty ratio of the first electrode fingers 14 and the second electrode fingers 24 in the second region 60.

As described in the third embodiment, the duty ratio of the second electrode finger 24 and the second dummy electrode finger 26 in the third regions 64 corresponding to at least two gaps 28a and 28b differ from the duty ratio of the first electrode fingers and the second electrode fingers in the second region 60. This structure allows the Q value in the region 70 to be further improved as described in the third embodiment.

Fourth Embodiment

Figure 16A:
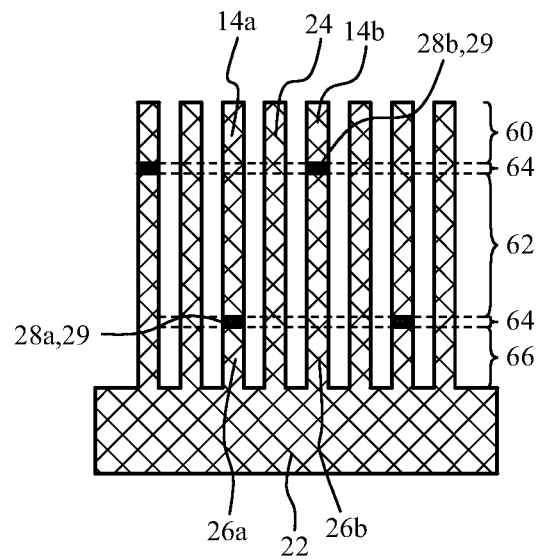
FIG. 16A is an enlarged view around a gap in a fourth embodiment.

A fourth embodiment forms an insulating film in which at least one of the first gap and the second gap is embedded. FIG. 16A is an enlarged view around a gap in the fourth embodiment. As illustrated in FIG. 16A, an insulating film 29 is formed so that the second gaps 28a and 28b are embedded therein. The same structure is applied to the first gap 18. Other structures are the same as those of the first embodiment, and a description thereof is omitted. As the fourth embodiment, fabricated was a resonator including an aluminum oxide ($Al_2O_3$) film having a film thickness same as the thickness of aluminum of the metal film 52 and embedded in the first gap 18 and the second gap 28. Other structures are the same as those of the first embodiment.

Figure 16B:
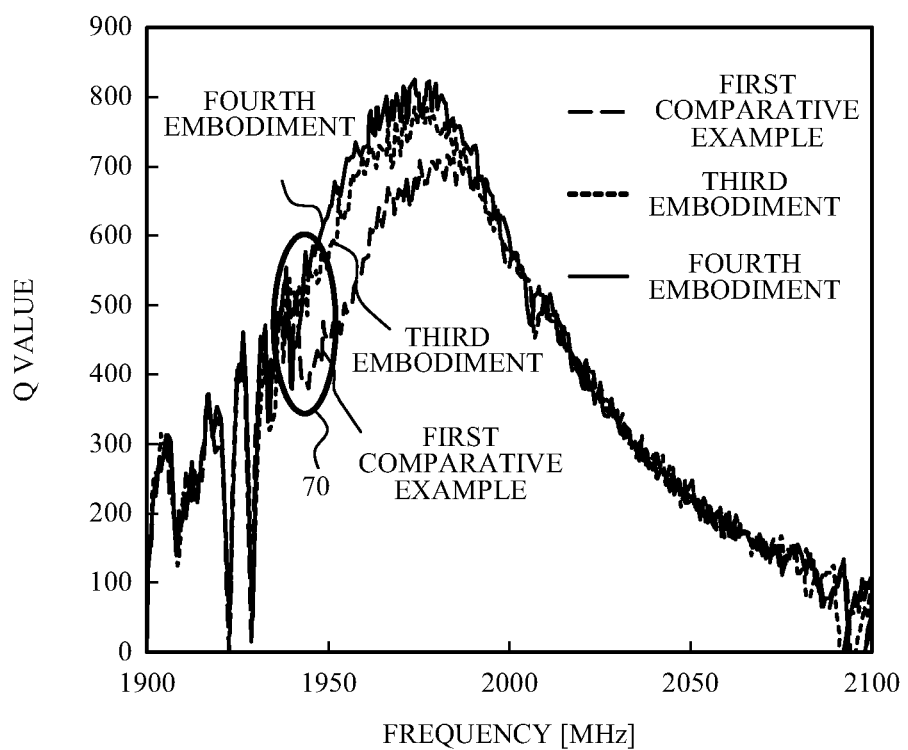
FIG. 16B is a diagram illustrating a Q value with respect to a frequency in the first comparative example and the third and fourth embodiments.

FIG. 16B is a diagram illustrating a Q value with respect to a frequency of the fabricated resonators of the first comparative example and the third and fourth embodiments. In the region 70, the Q value of the fourth embodiment is even greater than the Q value of the third embodiment.

The reason why the Q value is improved in the fourth embodiment is because the mechanical discontinuity in the first gap 18 and the second gap 28 is decreased and the acoustic wave becomes difficult to be scattered.

Figure 17A:
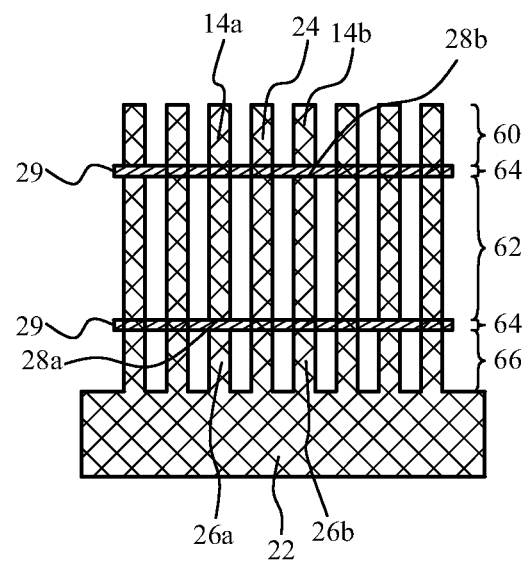
FIG. 17A and FIG. 17B are plan views illustrating a resonator in accordance with variations of the fourth embodiment.
Figure 17B:
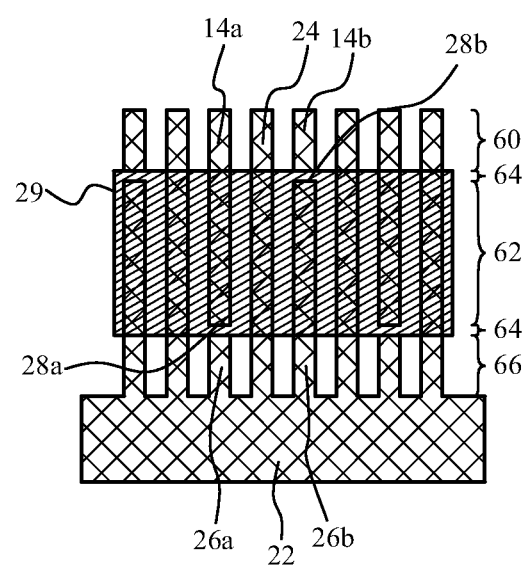

FIG. 17A and FIG. 17B are plan views illustrating a resonator in accordance with a variation of the fourth embodiment. As illustrated in FIG. 17A, the insulating film 29 may have a strip shape including the second gaps 28a or a strip shape including the second gaps 28b. That is to say, it may have a strip shape including the third regions 64. This structure makes the acoustic wave difficult to be scattered in the gap as in the fourth embodiment.

As illustrated in FIG. 17B, the insulating film 29 may have a strip shape including the second gaps 28a and 28b. That is to say, it may have a strip shape including the first region 62 and the third region 64. This structure makes the acoustic wave difficult to be scattered in the gap as in the fourth embodiment. Furthermore, the insulating film 29 is formed between the gaps 28c and 28d in FIG. 13, and thereby the velocity of the Rayleigh wave 72a changes. Therefore, the phase change of the Rayleigh wave 72a can be controlled. The phase can be controlled so that the Rayleigh waves 72a and 72b further cancel out each other.

The fourth embodiment and the variations thereof can improve the Q value by locating the insulating film 29 in at least two adjoining gaps 28a and 28b. To suppress the scattering in the gaps 28a and 28b, the insulating film 29 preferably mainly contains aluminum oxide, silicon oxide, or tantalum oxide. The fourth embodiment and the variation thereof can be applied to the resonators of the second and third embodiments.

The first through fourth embodiments describe a surface acoustic wave resonator as a resonator, but the resonator may be a boundary acoustic wave resonator or a Love wave resonator illustrated in FIG. 6A and FIG. 6B.

Fifth Embodiment

Figure 18A:
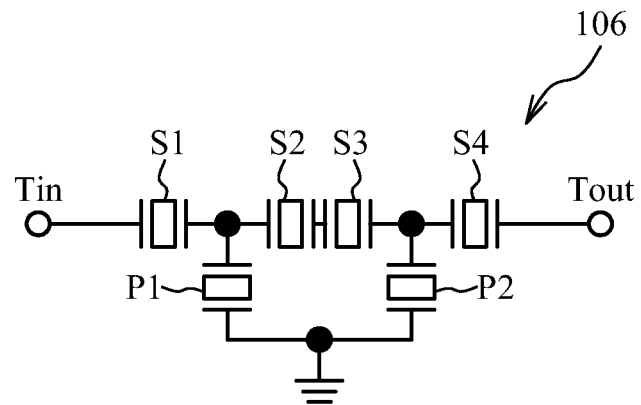
FIG. 18A is a circuit diagram illustrating a filter in accordance with a fifth embodiment.
Figure 18B:
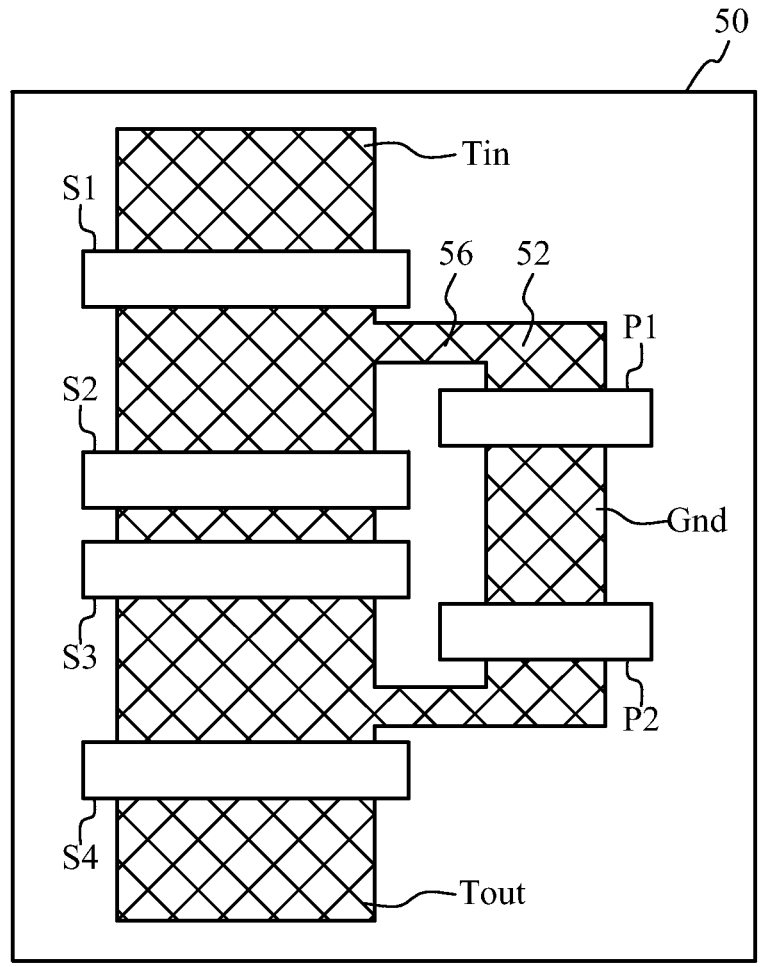
FIG. 18B is a plan view of the filter of the fifth embodiment.

A fifth embodiment is an exemplary filter using the resonator of the first embodiment. FIG. 18A is a circuit diagram of a filter in accordance with a fifth embodiment, and FIG. 18B is a plan view of the filter in accordance with the fifth embodiment. As illustrated in FIG. 18A, a filter 106 of the fifth embodiment includes series resonators S1 through S4 and parallel resonators P1 and P2. The series resonators S1 through S4 are connected in series between the input terminal Tin and the output terminal Tout. The parallel resonators P1 and P2 are connected in parallel between the input terminal Tin and the output terminal Tout.

As illustrated in FIG. 18B, the metal film 52 is formed on the piezoelectric substrate 50. The metal film 52 forms wirings 55, the series resonators S1 through S4, and the parallel resonators P1 and P2. A part of the wirings 55 functions as the input terminal Tin, the output terminal Tout, and the ground terminal Gnd.

Filters of a second comparative example and the fifth embodiment were fabricated. The fabricated filters have the following structure.

Piezoelectric substrate 50: 42° Y-cut lithium tantalate substrate

Metal film 52: aluminum, film thickness of 193 nm

Series resonators S1 through S4

Electrode finger pitch λ in the IDT: 2.0 μm

Number of pairs of the electrode fingers in the IDT: 116 pairs

Duty ratio in the IDT: 50%

Electrode finger pitch in the reflector: 1.0 μm

Number of the electrode fingers in the reflector: 40

Duty ratio in the reflector: 50%

Overlapping width AP: 20λ (40 μm)

Length of the dummy electrode finger: 2λ (4 μm)

Parallel resonators P1 and P2

Electrode finger pitch λ in the IDT: 2.07 μm

Number of pairs of the electrode fingers in the IDT: 80 pairs

Duty ratio in the IDT: 50%

Electrode finger pitch in the reflector: 1.035 μm

Number of the electrode fingers in the reflector: 40

Duty ratio in the reflector: 50%

Overlapping width AP: 20λ (41.4 μm)

Length of the dummy electrode finger: 2λ (4.14 μm)

In both the series resonators and the parallel resonators of the second comparative example, the IDT has duty ratios of 50% in the first region 62, the second region 60, the third region 64, and the fourth region 66. In the series resonators S1 through S4 of the fifth embodiment, the IDT has a duty ratio of 55% in the first region 62, and duty ratios of 50% in the second region 60, the third region 64, and the fourth region 66. In the parallel resonators P1 and P2, the IDT has duty ratios of 50% in the first region 62, the second region 60, the third region 64, and the fourth region 66. As described above, the duty ratio in the first region 62 of the series resonators S1 through S4 of the fifth embodiment is made to differ from others.

Figure 19A:
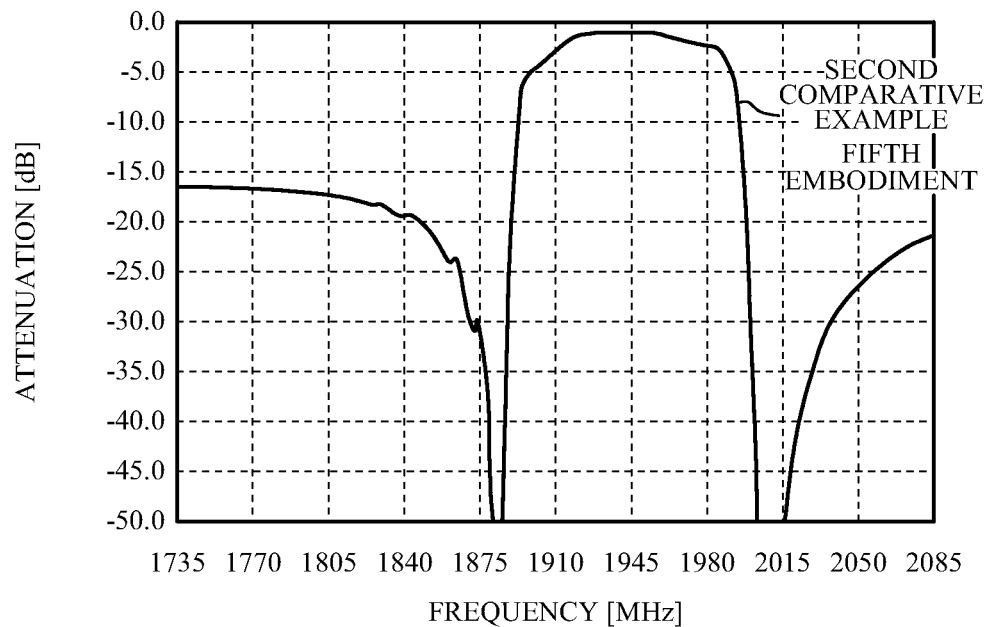
FIG. 19A illustrates pass characteristics in a second comparative example and the fifth embodiment.
Figure 19B:
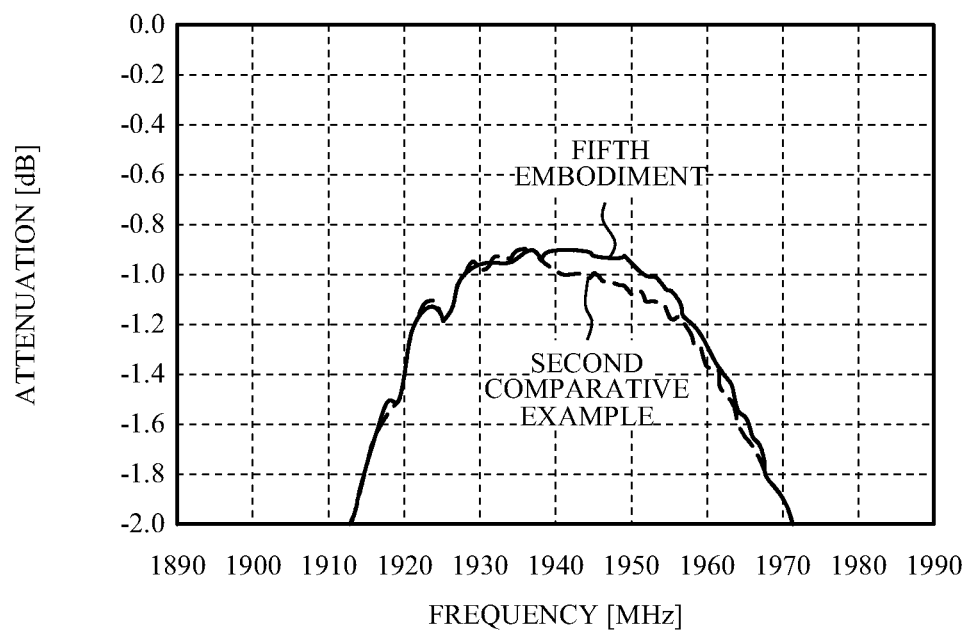
FIG. 19B is an enlarged view of the pass characteristics around the passband.

FIG. 19A illustrates pass characteristics in the second comparative example and the fifth embodiment, and FIG. 19B is an enlarged view of the pass characteristics around the passband. As illustrated in FIG. 19A, the second comparative example and the fifth embodiment have no difference in suppression characteristics around the passband. As illustrated in FIG. 19B, the loss of the passband in the fifth embodiment is less than that of the second comparative example by approximately 0.1 dB.

As described in the fifth embodiment, the filter may include at least one of the resonators of the first through fourth embodiments. This increases the degree of suppression outside the passband and decreases the loss in the passband. The filter may be a ladder-type filter illustrated in FIG. 18 and FIG. 1 or a multimode filter illustrated in FIG. 2 and FIG. 7. As described in FIG. 3, the filter may include a ladder-type filter and a multimode filter. In the ladder-type filter, the Q value of the series resonator affects the loss of the passband. Therefore, the series resonator is preferably the resonator of at least one of the first through fourth embodiments.

Sixth Embodiment

Figure 20:
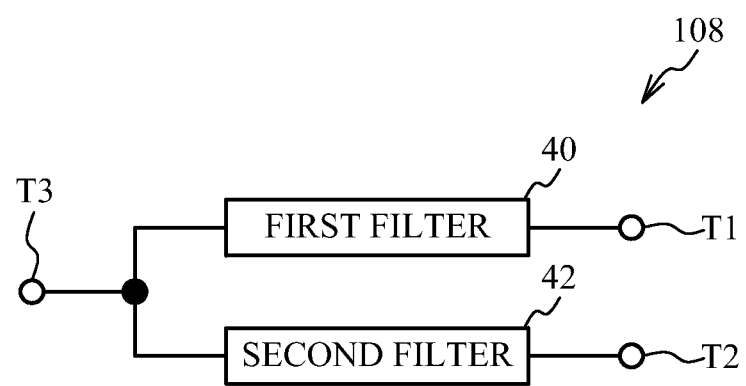
FIG. 20 is a circuit diagram of a duplexer in accordance with a sixth embodiment.

FIG. 20 is a circuit diagram of a duplexer in accordance with a sixth embodiment. As illustrated in FIG. 20, a duplexer 108 includes a first filter 40 and a second filter 42. The first filter 40 is connected between a common terminal T3 and a first terminal T1. The second filter 42 is connected between the common terminal T3 and a second terminal T2. The first filter 40 is, for example, a transmit filter, and the second filter 42 is, for example, a receive filter. The first terminal T1 is, for example, a transmit terminal, the second terminal T2 is, for example, a receive terminal, and the common terminal T3 is, for example, an antenna terminal.

At least one of the first filter 40 and the second filter 42 is preferably the filter of the fourth embodiment. This increases the degree of suppression outside the passband and decreases the loss in the passband.

The filter of the fifth embodiment or the duplexer of the sixth embodiment may be used for a communication module.

Although the embodiments of the present invention have been described in detail, it is to be understood that the various change, substitutions, and alterations could be made hereto without departing from the spirit and scope of the invention.

What is claimed is:

1. A resonator comprising:
a first comb-shaped electrode formed on a piezoelectric substrate and including a first bus bar, first electrode fingers coupled to the first bus bar and extending in an extension direction, and first dummy electrode fingers coupled to the first bus bar; and
a second comb-shaped electrode formed on the piezoelectric substrate and including a second bus bar, second electrode fingers coupled to the second bus bar, extending in the extension direction, and facing the first dummy electrode fingers through first gaps, and second dummy electrode fingers coupled to the second bus bar and facing the first electrode fingers through second gaps, wherein
$\Delta D$ is greater than or equal to $0.5\lambda$ and less than or equal to $3.5\lambda$ ($0.5\lambda \leq \Delta D \leq 3.5\lambda$) where $\Delta D$ represents a distance in the extension direction between at least two gaps that are at least adjoining two of the first gaps and/or at least adjoining two of the second gaps, and $\lambda$ represents a pitch of the first electrode finger and the second electrode finger.

2. The resonator according to claim 1, wherein
a duty ratio of electrode fingers and dummy electrode fingers in a first region between the at least two gaps in the extension direction differ from a duty ratio of the first electrode fingers and the second electrode fingers in a second region in which the first electrode fingers overlap with the second electrode fingers in the extension direction, the electrode fingers being the first electrode fingers and/or the second electrode fingers corresponding to the at least two gaps, and the dummy electrode fingers being the first dummy electrode fingers and/or the second dummy electrode fingers corresponding to the at least two gaps.

3. The resonator according to claim 2, wherein
the duty ratio of the electrode fingers and the dummy electrode fingers is greater than the duty ratio of the first electrode fingers and the second electrode fingers in the second region.

4. The resonator according to claim 2, wherein
the duty ratio of the electrode fingers and the dummy electrode fingers in third regions corresponding to the at least two gaps in the extension direction differ from the duty ratio of the first electrode fingers and the second electrode fingers in the second region.

5. The resonator according to claim 1, further comprising:
an insulating film located in the at least two gaps.

6. The resonator according to claim 1, wherein
the at least two gaps are the at least adjoining two of the first gaps and the at least adjoining two of the second gaps.

7. The resonator according to claim 1, wherein
the first gaps and/or the second gaps are alternately modulated by a distance $\Delta D$.

8. A filter comprising:
the resonator according to claim 1.

9. A duplexer comprising:
a first filter connected between a common terminal and a first terminal; and
a second filter connected between the common terminal and a second terminal, wherein
at least one the first filter and the second filter is the filter according to claim 8.

10. The resonator according to claim 1, wherein
the piezoelectric substrate is a lithium tantalate substrate or a lithium niobate substrate.

11. A resonator comprising:
a first comb-shaped electrode formed on a piezoelectric substrate and including a first bus bar, first electrode fingers coupled to the first bus bar and extending in an extension direction, and first dummy electrode fingers coupled to the first bus bar; and
a second comb-shaped electrode formed on the piezoelectric substrate and including a second bus bar, second electrode fingers coupled to the second bus bar, extending in the extension direction, and facing the first dummy electrode fingers through first gaps, and second dummy electrode fingers coupled to the second bus bar and facing the first electrode fingers through second gaps, wherein
$\Delta D$ is greater than or equal to $1.5\lambda$ and less than or equal to $3.0\lambda$ ($1.5\lambda \leq \Delta D \leq 3.0\kappa$) where $\Delta D$ represents a distance in the extension direction between at least two gaps that are at least adjoining two of the first gaps and/or at least adjoining two of the second gaps, and $\lambda$ represents a pitch of the first electrode finger and the second electrode finger.

12. A filter comprising:
the resonator according to claim 11.

13. A duplexer comprising:
a first filter connected between a common terminal and a first terminal; and
a second filter connected between the common terminal and a second terminal, wherein
at least one the first filter and the second filter is the filter according to claim 12.

* * * * *